(12) United States Patent
Kim

(10) Patent No.: US 6,459,307 B2
(45) Date of Patent: Oct. 1, 2002

(54) INPUT BUFFER HAVING DUAL PATHS

(75) Inventor: Yong-Ki Kim, Ichon-shi (KR)

(73) Assignee: Hynix Semiconductor, Seoul (KR)

( * ) Notice: Subject to any disclaimer, the term of this patent is extended or adjusted under 35 U.S.C. 154(b) by 0 days.

(21) Appl. No.: 09/896,437

(22) Filed: Jun. 28, 2001

(30) Foreign Application Priority Data

Jun. 29, 2000 (KR) ........................................ 2000-36386

(51) Int. Cl.[7] ................................................ H03K 3/00
(52) U.S. Cl. ........................ 327/112; 327/170; 327/391
(58) Field of Search ................................. 327/112, 108, 327/170, 379, 384, 389, 391; 326/26, 27, 83, 86, 87

(56) References Cited

U.S. PATENT DOCUMENTS

| | | | | |
|---|---|---|---|---|
| 5,414,312 A | * | 5/1995 | Wong ......................... | 327/170 |
| 5,699,000 A | * | 12/1997 | Ishikuri ...................... | 327/108 |
| 5,825,215 A | * | 10/1998 | Sugio et al. ................. | 327/112 |
| 5,923,192 A | * | 7/1999 | Hasegawa .................... | 327/112 |
| 6,304,120 B1 | * | 10/2001 | Taito ........................... | 327/112 |
| 6,307,409 B1 | * | 10/2001 | Wrathall ...................... | 327/112 |

* cited by examiner

*Primary Examiner*—Toan Tran
(74) *Attorney, Agent, or Firm*—Townsend and Townsend and Crew LLP

(57) ABSTRACT

An input buffer of the present invention has dual paths for increasing input signal processing speed by using two input buffers having input characteristics that differ from each other. The input buffer includes an input terminal receiving an external input signal; and first and second input buffers, both coupled to the input terminal for transferring an external input signal. The output signal of the second input buffer is blocked when the first input buffer transfers the external input signal, and the output signal of the first input buffer is blocked when the second input buffer transfers the external input signal.

7 Claims, 3 Drawing Sheets

INPUT BUFFER HAVING DUAL PATHS

CROSS-REFERENCES TO RELATED APPLICATIONS

This application claims priority from Korean Application, entitled "Input Buffer having Double Path" Application No. 2000-36386 and filed on Jun. 29, 2000 and incorporates by reference its disclosure for all purposes.

BACKGROUND OF THE INVENTION

1. Field of the Invention

The present invention relates to an input buffer having dual paths in a semiconductor device, and, more particularly, to an input buffer capable of increasing input signal processing speed by using dual-path input buffers.

2. Prior Art of the Invention

Generally, a semiconductor device includes a terminal for receiving external input signals and a power voltage. A number of control signals are applied to the terminal, which in turn supplies the signals to an inner chip of the semiconductor device through an external pin of a package. An input buffer is indispensable for detecting control signals. In semiconductor devices that use CMOS logic, the external input signals must be adapted or converted to CMOS logic levels within the chip. Therefore, a CMOS semiconductor device must have at least one input buffer capable of converting signals from external levels to internal levels.

The input buffer used in a CMOS semiconductor device can have various forms. For this reason, the input buffer must be properly designed to correspond to the device. For example, in the art there is a static input buffer of the inverter type (i.e., CMOS inverter) which has both a PMOS device and an NMOS device. The input of the CMOS inverter is coupled to an external terminal and the output of the CMOS inverter is coupled to an internal signal transfer gate. The signals passing through the two buffers (e.g., the inverter and gate) are converted to a CMOS logic level commensurate with or equivalent to the internal signals having the full range of driving between a voltage (e.g., VDD) and a ground voltage.

Another example is a differential type input buffer in which one gate of a MOS pair (i.e., NMOS-PMOS pair) having a current-mirror-type current source is coupled to a reference voltage and the other gate is coupled to the input terminal. These two terminals are coupled to an input of a second buffer, which is a CMOS inverter having CMOS-level output.

The logic threshold voltage of the input buffer typically has a median value of logic input high VIH and logic input low VIL. Therefore, the logic high signal and the logic low signal are designed to transfer at the same speed.

The time needed to adapt or convert an external control signal to a CMOS logic level signal through an internal input buffer varies depending on conditions. For example, when the slew (V/sec) of an external control signal is great, the conversion time is short. If the logic high level (VIH) of an external signal is higher than the logic low level (VIL), the high signal is rapidly transferred. Conversely, if the logic high level of an external signal is lower than the logic low level, the low signal is rapidly transferred. Therefore, in order to balance the two logic signals, the slew of the external input signal and the flows of the VIH and the VIL must be constant.

FIG. 1 is a circuit diagram of a conventional input buffer. In a conventional input buffer, one input terminal is coupled to one input buffer. An internal operation signal processed by the input buffer is applied for internal operation of the semiconductor device. Since both the logic high signal and the logic low signal of the internal operation signal are transferred through the same buffer, transfer characteristics of the logic high signal and the logic low signal are designed to be equal. That is, the threshold voltage VIH+VIL/2 is applied and inversion is executed by variation of the input signal.

In the conventional input buffer, a first stage of the input buffer could be enlarged (i.e., increased device size) for faster transfer of the external control signal, but this results in increased power consumption. Although the size of the buffer input can be designed to skew its output for a special-purpose input buffer to effect a fast transfer of the logic high signal, this causes serious distortion of the other signal (i.e., logic low). That is, when the high signal is highlighted, or active, the low signal is distorted and, conversely, when the low signal is highlighted, or active, the high signal is distorted.

The conventional input buffer design thus has at least two disadvantages. First, when the external control signal input conditions change, the transfer speed of the internal signal cannot be increased without distorting either the logic high signal or the logic low signal. Second, input buffer enlargement to increase the transfer speed of the external control signal leads to increased power consumption. Therefore, there is a need to overcome these disadvantages.

SUMMARY OF THE INVENTION

The present invention provides a dual-path input buffer for increasing the input signal processing speed by using two input buffers, where each input's input characteristics differ from each other.

In accordance with one aspect of the present invention, an input buffer of a semiconductor device comprises: an input terminal receiving an external input signal; and a first and a second input buffer, both coupled to the input terminal for transferring the received external input signal, wherein the output signal of the second input buffer is blocked when the first input buffer transfers the received external input signal, and the output signal of the first input buffer is blocked when the second input buffer transfers the received external input signal.

In accordance with another aspect of the present invention, an input buffer of a semiconductor device comprises: an input terminal receiving an external input signal; and a first and a second input buffer, both coupled to the input terminal for transferring the received external input signal; a control signal generating circuit receiving the outputs of the first and second input buffers to generate a control signal for controlling the transfer paths of the first and second input buffers; and a latch circuit receiving signals from the first and second input buffers to generate an internal operation signal for the semiconductor device.

BRIEF DESCRIPTION OF THE DRAWINGS

The above and other features of the instant invention will become apparent from the following description of specific embodiments taken in conjunction with the accompanying drawings, wherein.

SPECIFIC EMBODIMENT OF THE INVENTION

Hereinafter, specific embodiments of the present invention will be described in detail with reference to the accompanying drawings.

Figure 1:
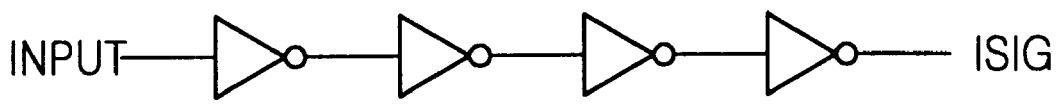
FIG. 1 illustrates a conventional input buffer circuit.
Figure 2:
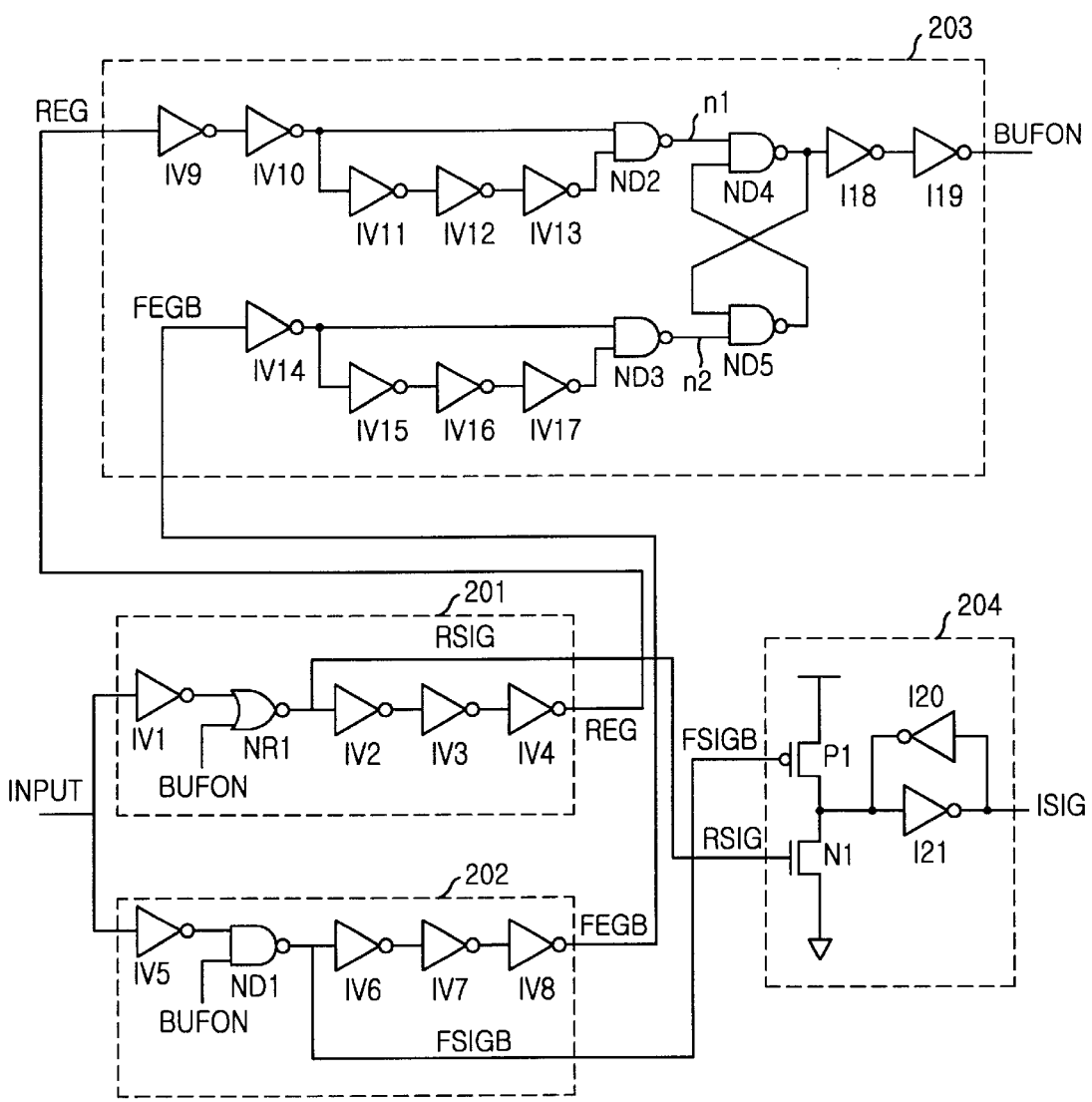
FIG. 2 is a circuit diagram illustrating an input buffer having dual paths in accordance with the present invention.

FIG. 2 is a circuit diagram of a dual-path input buffer in accordance with the present invention. As shown in FIG. 2, a first input buffer 201 transfers the logic high signal of an external input signal and a second input buffer 202 transfers the logic low signal of the external input signal. A control signal generating circuit 203 receives the outputs REG, FEGB of the first and second input buffers and generates a control signal BUFON for controlling the transfer paths of the input buffers. A latch circuit 204 receives signals RSIG and FSIGB from the first and second input buffers, respectively, for generating an internal operation signal for internal operation of the semiconductor device.

First input buffer 201, for example, includes a NOR gate NR1 for logically combining an output of an inverter IV1, which inverts the external input signal, and a control signal BUFON. Buffer 201 also includes a number of inverters IV2, IV3, IV4 serially coupled for receiving the output of NOR gate NR1. Second input buffer 202 includes a NAND gate ND1 for logically combining an output of an inverter IV5, which inverts the external input signal, and the control signal BUFON. Buffer 202 also includes a number of inverters IV6, IV7, IV8 serially coupled for receiving the output of NAND gate ND1. Latch circuit 204 includes a PMOS transistor P1 receiving the RSIG signal from first input buffer 201 and an NMOS transistor N1 receiving the FEGB signal from the second input buffer 202, where both RSIG and FEGB are used for internal operation of the device.

The control signal generating circuit 203 includes a NAND gate ND2 for logically combining outputs of inverters IV9, IV10 for inverting the output signal REG of first input buffer 201 and an output of a plurality of inverters IV11, IV12, IV13 for delaying the output signal REG. Circuit 203 also includes a NAND gate ND3 for logically combining an output of an inverter IV14 and an output signal of a plurality of inverters. IV14 operates to invert the output signal REGB of second input buffer 202 and an output signal of a plurality of inverters IV15, IV16, IV17, which is a delayed signal of the output signal FEGB of second input buffer 202, (i.e., a delayed FEGB signal). NAND gate latch circuits ND4, ND5 operate to latch the outputs of NAND gates ND2, ND3, and inverters IV18, IV19 are used to invert the outputs of the NAND gate latch circuits ND4, ND5 to generate the control signal BUFON.

As described above, since two input buffers 201, 202 are coupled to a single input terminal and are configured differently, the threshold voltage of the first input buffer is different from that of the second input buffer. For example, in latch circuit 204, the size of the NMOS transistor N1 at a first stage is larger than that of the PMOS transistor P1 for fast transfer of a logic high signal. Therefore, the threshold voltage is lowered.

As described above and in another embodiment, the configuration of the first stage of both input buffers 201, 202 are coupled to a single input terminal and functions as an inverter having, for example, a PMOS transistor P1 and an NMOS transistor N1. That is, the configuration of the first stage of both input buffers 201, 202 coupled to the single input terminal is a current-mirror type of PMOS transistor P1 or NMOS transistor N1. Therefore, the outputs of both input buffers 201, 202 which are logically combined and configured to latch an internal signal ISIG.

The output signals REG, FEGB of input buffers 201, 202 are thus combined at the control signal generating circuit 203 to generate the control signal BUFON that controls the paths of first and second input buffers 201, 202. That is, when the first input buffer transfers a signal, transfer of the output signal of the second input buffer is blocked by the generated control signal BUFON. Conversely, when the second input buffer transfers a signal, transfer of the output signal of the first input buffer is blocked by the generated control signal BUFON.

Next, transition from a logic low state to a logic high state of an external signal, in accordance with the present invention, is described. The output signal REG of first input buffer 201 is a signal used to indicate that the first input buffer 201 has received a high external input signal. When the output signal REG is applied to control signal generating circuit 203, the control signal BUFON, which controls first and the second input buffers 201, 202, is inverted to a high logic level to block the transfer path of first input buffer 201. This also provides a transfer path through second input buffer 202. Before completion of this operation, the signal RSIG of first input buffer 201 is latched as the internal operation signal ISIG of the semiconductor device. Here, the RSIG and FSIGB signals from first and second input buffers 201, 202 are used for internal operation of the semiconductor device.

Conversely, when the external input signal transits from the logic high state to the logic low state, output signal FEGB of second input buffer 202 is applied to control signal generating circuit 203 so that the control signal BUFON is inverted from logic high to logic low. The inverted control signal blocks the transfer path of second input buffer 202, but provides the transfer path through first input buffer 201.

Subsequently, first input buffer 201 rapidly transfers the high signal via control signal BUFON and second input buffer 202 rapidly transfers the low signal via control signal BUFON. Therefore, the internal operation signal ISIG of the semiconductor device can use a faster signal than the transfer signal of a conventional single input buffer.

Figure 3:
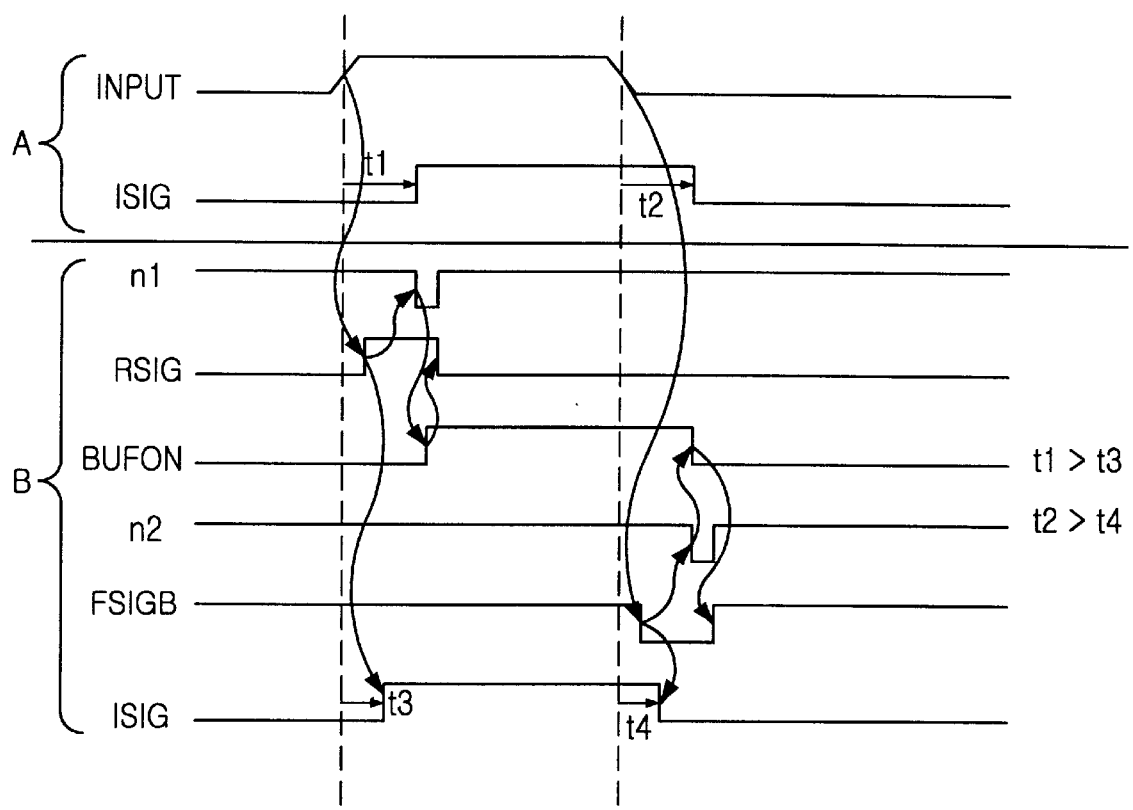
FIG. 3 is a timing diagram comparing waveforms of a conventional input buffer to that of a dual-path input buffer of the present invention.

FIG. 3 is a timing diagram for comparing waveforms of a conventional input buffer and a dual-path input buffer of the present invention. In FIG. 3, "A" waveforms depict a timing diagram of a conventional input buffer and "B" waveforms depict that of an input buffer of the present invention.

In timing diagram A, t1=t2 because input signal processing speeds are limited to a single-input buffer configuration having a single path.

In the timing diagram B, t3=t4 at the input buffers, then each is adjusted to be faster. Therefore, (t1=t2)>(t3=t4) so that a faster internal signal can be obtained.

As described above, an input buffer having dual paths in accordance with the present invention, delivers faster input signal processing speed than the conventional technique, improving operation performance of a semiconductor device, when the buffer and the semiconductor device are manufactured by the same technique.

While the present invention has been shown and described with respect to the particular embodiments, it will be apparent to those skilled in the art that many changes and modifications may be made without departing from the spirit and scope of the invention as defined in the appended claims.

What is claimed is:

1. An input buffer of a semiconductor device, comprising:

an input terminal configured to receive an external input signal;

a first buffer circuit having an input coupled to the input terminal;

a second buffer circuit having an input coupled to the input terminal, wherein the first and the second buffer circuits are configured to transfer the external input signal via respective transfer paths;

a control signal generating circuit configured to receive output signals from the first and second buffer circuits and to generate a control signal to control the transfer paths of the first and the second buffer circuits, wherein the control signal generating circuit includes:

a first logic circuit for-logically combining the output signal of the first buffer circuit and a delayed output signal of the first buffer circuit;

a second logic circuit for logically combining the output signal of the second buffer circuit and a delayed output signal of the second buffer circuit; and a first latch circuit for latching the output signal of the first logic circuit and the output signal of the second logic circuit; and a second latch circuit configured to receive transferred external input signals from the first and the second buffer circuits and to generate an internal operation signal of the semiconductor device.

2. The input buffer of claim 1, wherein the first buffer circuit includes:

a third logic circuit for logically combining an inverted signal of the external input signal and the control signal; and a number of first serially-coupled inverters for receiving the output signal of the first logic circuit;

and wherein the second buffer circuit includes:

a fourth logic circuit for logically combining the inverted signal of the external input signal and the control signal; and a number of second serially-coupled inverters for receiving the output signal of the second logic circuit.

3. The input buffer of claim 2, wherein the third logic circuit is a NOR circuit and the fourth logic circuit is a NAND circuit.

4. The input buffer of claim 1, wherein the second latch circuit includes:

a first transistor for receiving a transferred external input signal from the second buffer circuit; and a second transistor for receiving the transferred external input signal from the first buffer circuit.

5. The input buffer as recited in claim 4, wherein the first transistor is a PMOS transistor and the second transistor is an NMOS transistor.

6. The input buffer of claim 1 wherein the first logic circuit and the second logic circuit are NAND circuits and the first latch circuit is a NAND latch circuit.

7. The input buffer of claim 1, wherein the second latch circuit includes:

a first transistor having a gate terminal coupled to receive an output signal of the second buffer circuit;

a second transistor having a gate terminal coupled to receive an output signal of the first buffer circuit, wherein a threshold voltage of the first transistor is different from a threshold voltage of the second transistor; and a latch for providing the internal operation signal in response to the output signals of the first and second buffer circuits.

* * * * *